United States Patent
Sheng

(10) Patent No.: US 8,443,332 B2
(45) Date of Patent: May 14, 2013

(54) PROGRAM CALLING SYSTEM AND METHOD

(75) Inventor: Xiao-Cheng Sheng, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 168 days.

(21) Appl. No.: 12/840,730

(22) Filed: Jul. 21, 2010

(65) Prior Publication Data

US 2011/0099564 A1 Apr. 28, 2011

(51) Int. Cl.
*G06F 15/04* (2006.01)
*G06F 17/50* (2006.01)

(52) U.S. Cl.
USPC .......... 716/139; 715/210; 715/243; 715/273; 715/700

(58) Field of Classification Search ... 716/139; 715/210, 715/243, 273, 700
See application file for complete search history.

(56) References Cited

FOREIGN PATENT DOCUMENTS

CN 101025686 A 8/2007

OTHER PUBLICATIONS

Cadence Orcad Capture, User's guide, second edition May 31, 2000.*

* cited by examiner

*Primary Examiner* — Vuthe Siek
*Assistant Examiner* — Brian Ngo
(74) *Attorney, Agent, or Firm* — Altis Law Group, Inc.

(57) ABSTRACT

A program calling system includes a memory, an interface establishing unit, a detecting unit, and a calling unit. The memory stores functions for PCB layout design. Each function corresponds to a path and a name, and can be accessed via the corresponding path and name. The interface establishing unit establishes a user interface. The user interface includes a first area for displaying the names of the functions. A one to one relationship exists between the names and the paths of the functions. The detecting unit detects whether a calling signal is generated, and obtains a name of a to-be-called function when the calling signal is generated. The calling unit responds to the calling signal to obtain a path of the to-be-called function according to the name of the to-be-called function and the one to one relationship, and call the to-be-called function according to the obtained path and name.

18 Claims, 3 Drawing Sheets

PROGRAM CALLING SYSTEM AND METHOD

BACKGROUND

1. Technical Field

The present disclosure relates to printed circuit board (hereinafter "PCB") layout design; and particularly to a program calling system and method for PCB layout design.

2. Description of Related Art

Current PCB layout design software uses complex function calls that includes both name and path of each function, thus the user needs to remember the names and the paths of the functions to call the functions. However, the path of each function is often too long, this is inconvenient.

Therefore, there is room for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
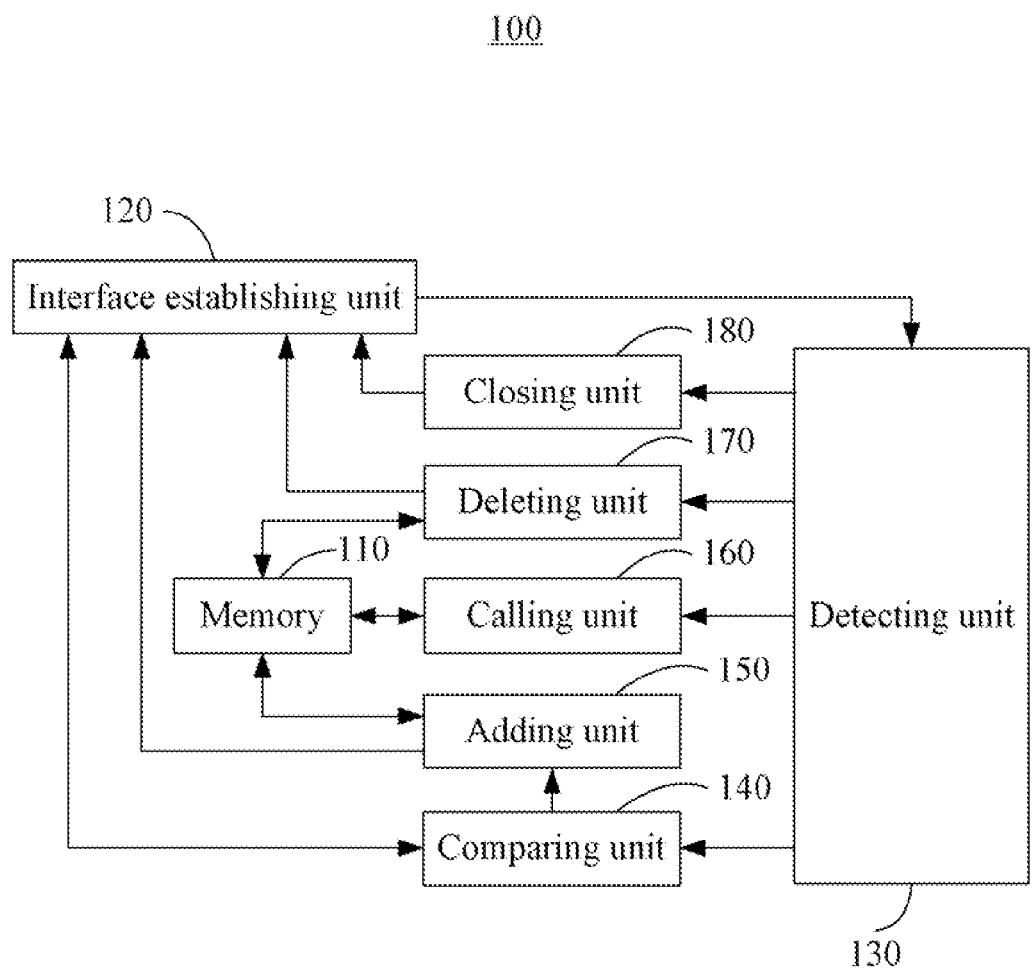
FIG. 1 is a block diagram of a program calling system for PCB layout design in accordance with an exemplary embodiment, the program calling system having a user interface.
Figure 2:
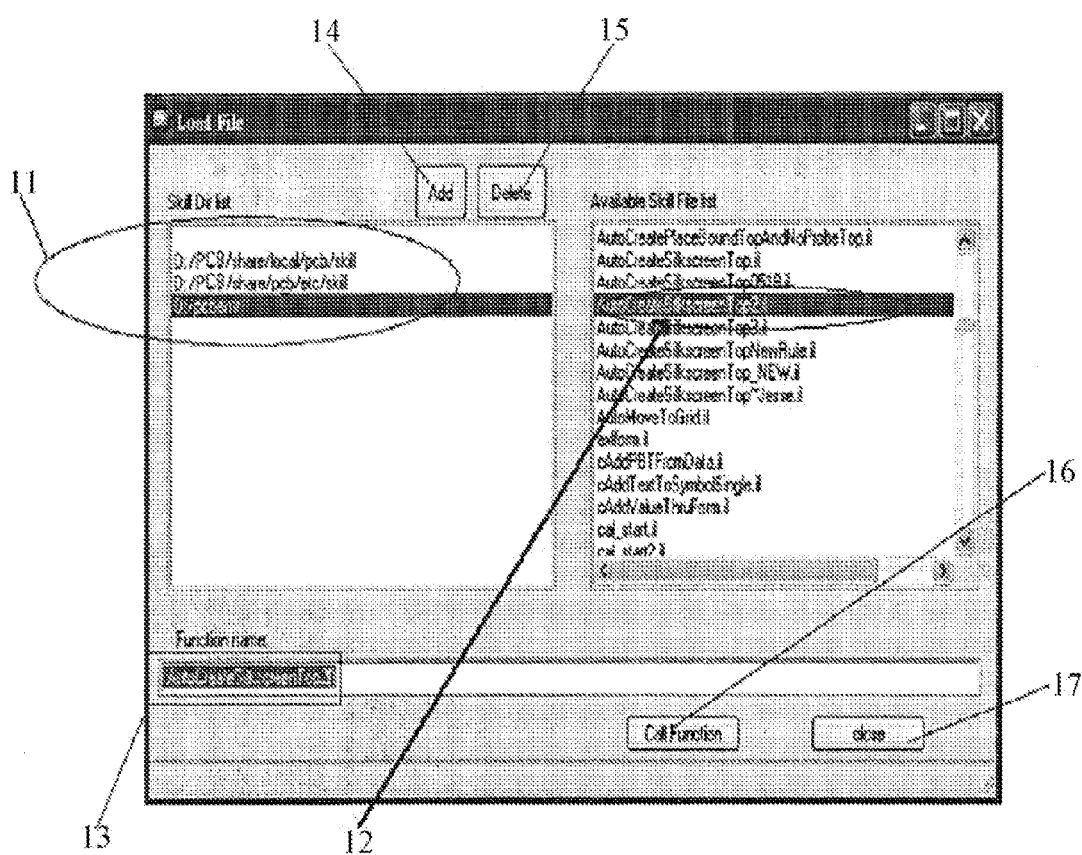
FIG. 2 is a schematic view of the user interface of the program calling system of FIG. 1.

Referring to FIGS. 1 and 2, a program calling system 100 for PCB layout design includes a memory 110, an interface establishing unit 120, a detecting unit 130, a comparing unit 140, an adding unit 150, a calling unit 160, a deleting unit 170, and a closing unit 180.

The memory 110 is used for storing several functions for PCB layout design such as for adjusting directions of letters to-be-printed on the PCB. Each function corresponds to a name and a path, and each function can be accessed via the corresponding name and path.

The interface establishing unit 120 is used for establishing a user interface 10. The user interface 10 includes a first area 12 for displaying names of the functions, and a second area 11 for displaying paths of the functions. A one to one relationship exists between the names and the paths of the functions. That is, when the name of one of the functions in the first area 12 is selected, the corresponding path of the function will be obtained according to the selected name of the function and the one to one relationship.

The detecting unit 130 is used for detecting whether a detecting signal is generated, and obtaining a name and path of a to-be-added function when the detecting signal is generated. In the embodiment, the user interface 10 includes an "Add" button 14. When the "Add" button 14 is selected, the detecting signal is generated.

The comparing unit 140 is used for responding to the detecting signal to compare the name of the to-be-added function with the names of the functions displayed in the first area 12, to determine whether the to-be-added function exists in the first area 12. When it is determined that the to-be-added function does not exist in the first area 12, the comparing unit 140 generates an adding signal to the adding unit 150.

The adding unit 150 is used for responding to the adding signal to respectively add the name and path of the to-be-added function into the first area 12 and the second area 11 of the user interface 10.

The detecting unit 130 is further used for detecting whether a calling signal is generated, and obtaining a name of a to-be-called function when the calling signal is generated. In the embodiment, the user interface 10 includes a third area 13 for displaying the name of the to-be-called function and a "Call Function" button 16. When the "Call Function" button 16 is selected, the calling signal is generated. The detecting unit 130 uses the function, displayed in the first area 12 which name is selected, as the to-be-called function, and when the "Call Function" button 16 is selected, and the name of the to-be-called function is displayed in the third area 13.

The calling unit 160 is used for responding to the calling signal to obtain a path of the to-be-called function according to the name of the to-be-called function and the one to one relationship, and call the to-be-called function according to the obtained path and name of the to-be-called function. Therefore, the user need not remember the path of the to-be-called function to call the to-be-called function. In addition, when the "Call Function" button 16 is selected, the path of the to-be-called function displayed in the second area 11 is highlighted.

The detecting unit 130 is further used for detecting whether a deleting signal is generated, and obtaining a name of a to-be-deleted function when the deleting signal is generated. In the embodiment, the user interface 10 includes a "Delete" button 15. When the "Delete" button 15 is selected, the deleting signal is generated. The detecting unit 130 uses the function, displayed in the first area 12 which name is selected, as the to-be-deleted function.

The deleting unit 170 is used for responding to the deleting signal to obtain a path of the to-be-called function according to the name of the to-be-deleted function and the one to one relationship, and delete the name and path of to-be-deleted function from the first area 12 and the second area 11 of the user interface 10. In addition, when the "Delete" button 15 is selected, the path of the to-be-deleted function displayed in the second area 11 is highlighted.

The detecting unit 130 is further used for detecting whether a closing signal is generated. In the embodiment, the user interface 10 includes a "Close" button 17. When the "Close" button 17 is selected, the closing signal is generated. The closing unit 180 is used for responding to the closing signal to close the user interface 10 and exit the program calling system 100.

Figure 3:
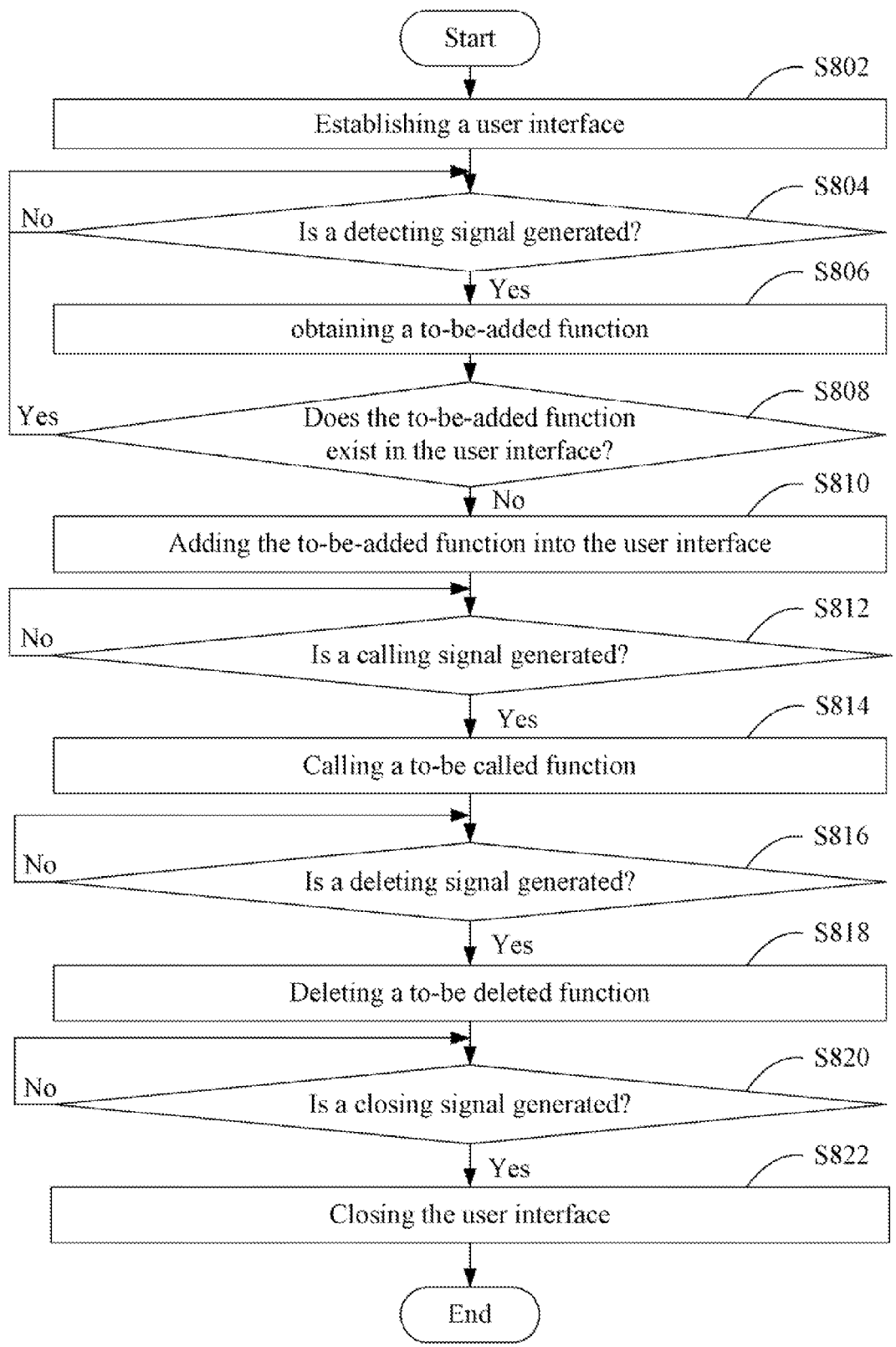
FIG. 3 is a flowchart of a program calling method for PCB layout design in accordance with an exemplary embodiment.

Referring to FIGS. 2 and 3, a program calling method is used for calling functions to design PCB layout. The functions may be stored in a memory. Each function corresponds to a name and a path, and each function can be accessed via the corresponding name and path. The program calling method includes the following steps.

In step S802, establishing a user interface. In the embodiment, the user interface 10 includes a first area 12 for displaying names of the functions, and a second area 11 for displaying paths of the functions. A one to one relationship exists between the names and the paths of the functions. That is, when the name of one of the functions in the first area 12 is selected, the corresponding path of the function will be obtained according to the selected name of the function and the one to one relationship.

In step S804, detecting whether a detecting signal is generated. If the detecting signal is generated, step S806 is implemented. If the detecting signal is not generated, step S804 is implemented. In the embodiment, the user interface 10 further includes an "Add" button 14, and when the "Add" button 14 is selected, the detecting signal is generated.

In step S806, obtaining a name and path of a to-be-added function.

In step S808, determining whether the to-be-added function exists in the user interface 10. If the to-be-added function does not exist in the user interface 10, step S810 is implemented. If the to-be-added function exists in the user interface 10, step S804 is implemented. In the embodiment, whether the to-be-added exists in the user interface is determined by comparing the name of the to-be-added function with the names of the functions displayed in the first area 12.

In step S810, adding the name and path of the to-be-added function respectively into the first area 12 and the second area 11 of the user interface 10.

In step S812, detecting whether a calling signal is generated. If the calling signal is generated, step S814 is implemented. If the calling signal is not generated, step S812 is implemented. In the embodiment, the user interface 10 further includes a "Call Function" button 16, and when the "Call Function" button 16 is selected, the calling signal is generated.

In step S814, obtaining a name of the to-be-called function and then obtaining a path of the to-be-called function according to the name of the to-be-called function and the one to one relationship, and calling the to-be-called function according to the obtained path and name of the to-be-called function. Therefore, the user need not remember the path of the to-be-called function to call the to-be-called function. In the embodiment, the user interface 10 further includes a third area 13. The function, displayed in the first area 12 which name is selected, is used as the to-be-called function, and when the "Call Function" button 16 is selected, the path of the to-be-called function displayed in the second area 11 is highlighted, and the name of the to-be-called function is displayed in the third area 13.

In step S816, detecting whether a deleting signal is generated. If the deleting signal is generated, step S818 is implemented. If the deleting signal is not generated, step S816 is implemented. In the embodiment, the user interface 10 further includes a "Delete" button 15, and when the "Delete" button 15 is selected, the deleting signal is generated.

In step S818, obtaining a name of a to-be-deleted function and obtaining a path of the to-be-deleted function according to the name of the to-be-deleted function and the one to one relationship, and delete the name and path of the to-be-deleted function from the first area 12 and the second area 11 of the user interface 10. In the embodiment, the function, displayed in the first area 12 which name is selected, is used as the to-be-deleted function, and when the "Delete" button 15 is selected, the path of the to-be-deleted function displayed in the second area 11 is highlighted.

In step S820, detecting whether a closing signal is generated. If the closing signal is generated, step S822 is implemented. If the closing signal is not generated, step S820 is implemented. In the embodiment, the user interface 10 further includes a "Close" button 17, and when the "Close" button 17 is selected, the closing signal is generated.

In step S822, closing the user interface 10.

It is to be understood, however, that even though information and advantages of the present embodiments have been set forth in the foregoing description, together with details of the structures and functions of the present embodiments, the disclosure is illustrative only; and that changes may be made in detail, especially in matters of shape, size, and arrangement of parts within the principles of the present embodiments to the full extent indicated by the broad general meaning of the terms in which the appended claims are expressed.

What is claimed is:

1. A program calling system used for PCB layout design, the program calling system comprising:

a memory adapted to store a plurality of different functions for PCB layout design, each function corresponding to a path and a name, and capable of being accessed via the corresponding path and name;

an interface establishing unit adapted to establish a user interface, the user interface comprising a first area for displaying the names of the functions, and a one to one relationship existing between the names and the paths of the functions;

a detecting unit adapted to detect whether a calling signal is generated, and obtaining a name of a to-be-called function when the calling signal is generated an adding unit, the detecting unit further adapted to detect whether a detecting signal is generated, and obtain a name and path of a to-be-added function when the detecting signal is generated; the adding unit adapted to respond to the detecting signal to add the name of the to-be-added function into the first area of the user interface; and a calling unit adapted to respond to the calling signal to obtain a path of the to-be-called function according to the name of the to-be-called function and the one to one relationship, and call the to-be-called function to be executed according to the obtained path and name of the to-be-called function.

2. The program calling system according to claim 1, wherein the detecting unit uses the function, displayed in the first area which name is selected, as the to-be-called function.

3. The program calling system according to claim 1, wherein the user interface further comprises a second area for displaying the paths of the functions, and the path of the to-be-called function displayed in the second area is highlighted when the calling signal is generated.

4. The program calling system according to claim 1, wherein the user interface further comprises a third area; and the name of the to-be-called function is displayed in the third area when the calling signal is generated.

5. The program calling system according to claim 1, wherein the user interface further comprises a second area for displaying the paths of the functions, the adding unit further adapted to respond to the detecting signal to add the path of the to-be-added function into the second area of the user interface.

6. The program calling system according to claim 1, further comprising a comparing unit, the comparing unit adapted to respond to the detecting signal to determine whether the to-be-added function exists in the user interface, and generate an adding signal when it is determined that the to-be-added function does not exist in the first area; the adding unit adapted to respond to the adding signal to add the name of the to-be added function into the first area of the user interface.

7. The program calling system according to claim 6, wherein the comparing unit determines whether the to-be-added function exists in the user interface by comparing the name of the to-be-added function with the names of the functions displayed in the first area.

8. The program calling system according to claim 1, further comprising a deleting unit, the detecting unit further adapted to detect whether a deleting signal is generated, and obtain a name of a to-be-deleted function when the deleting signal is generated; the deleting unit adapted to delete the name of the to-be-added function from the first area of the user interface.

9. The program calling system according to claim 8, wherein the user interface further comprises a second area for displaying the paths of the functions, the deleting unit further adapted to respond to the deleting signal to delete the path of the to-be-deleted function from the second area of the user interface.

10. The program calling system according to claim 8, wherein the detecting unit uses the function, displayed in the first area which name is selected, as the to-be-deleted function.

11. The program calling system according to claim 8, wherein the user interface further comprises a second area for displaying the paths of the functions, and the path of the to-be-deleted function displayed in the second area is highlighted when the deleting signal is generated.

12. The program calling system according to claim 1, further comprising a closing unit, the detecting unit further adapted to detect whether a closing signal is generated; the closing unit adapted to respond to the closing signal to close the user interface and exit the program calling system.

13. A program calling method for calling functions to design PCB layout, each function corresponding to a path and a name, and each function capable of being accessed via the corresponding path and name, the program calling method comprising:

establishing a user interface by a computer, the user interface comprising a first area for displaying the names of the different functions and a one to one relationship existing between the names and the paths of the functions detecting whether a detecting signal is generated;

if the detecting signal is generated, obtaining a name and path of a to-be-added function;

determining whether the to-be-added function exists in the user interface;

if the to-be-added function does not exist in the user interface, adding the name of the to-be-added function into the first area;

detecting whether a calling signal is generated by the computer; and if the calling signal is generated, obtaining a name of a to-be-called function and then obtaining a path of the to-be-called function according to the name of the to-be-called function and the one to one relationship, and calling the to-be-called function to be executed according to the obtained path and name of the to-be-called function.

14. The program calling method according to claim 13, wherein the function, displayed in the first area which name is selected, is used as the to-be-called function.

15. The program calling method according to claim 13, wherein the user interface further comprises a second area for displaying the paths of the functions, and the path of the to-be-called displayed in the second area is highlighted when the calling signal is generated.

16. The program calling method according to claim 13, further comprising:

detecting whether a deleting signal is generated; and if the deleting signal is generated, obtaining a name of a to-be-deleted function and then obtaining the path of the to-be-deleted function according to the name of the to-be-deleted function and the one to one relationship, and delete the name of the to-be-deleted function from the first area.

17. The program calling method according to claim 16, wherein the function, displayed in the first area which name is selected, is used as the to-be-deleted function.

18. The program calling method according to claim 13, further comprising:

detecting whether a closing signal is generated; and if the closing signal is generated, closing the user interface.

* * * * *